(12) United States Patent
John et al.

(10) Patent No.: US 10,296,465 B2
(45) Date of Patent: May 21, 2019

(54) PROCESSOR USING A LEVEL 3 TRANSLATION LOOKASIDE BUFFER IMPLEMENTED IN OFF-CHIP OR DIE-STACKED DYNAMIC RANDOM-ACCESS MEMORY

(71) Applicant: Board of Regents, The University of Texas System, Austin, TX (US)

(72) Inventors: Lizy K. John, Austin, TX (US); Jee Ho Ryoo, Austin, TX (US); Nagendra Gulur, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 42 days.

(21) Appl. No.: 15/654,828

(22) Filed: Jul. 20, 2017

(65) Prior Publication Data

US 2018/0150406 A1 May 31, 2018

Related U.S. Application Data

(60) Provisional application No. 62/427,602, filed on Nov. 29, 2016.

(51) Int. Cl.
*G06F 12/10* (2016.01)
*G06F 12/1045* (2016.01)
(Continued)

(52) U.S. Cl.
CPC ........ *G06F 12/1063* (2013.01); *G06F 3/0647* (2013.01); *G06F 11/073* (2013.01);
(Continued)

(58) Field of Classification Search
CPC .. G06F 12/1063; G06F 3/0647; G06F 11/073; G06F 12/0802; G06F 12/1009; G06F 12/1054; G11C 7/1006
See application file for complete search history.

(56) References Cited

U.S. PATENT DOCUMENTS 5,630,088 A * 5/1997 Gupta ................. G06F 12/1036
711/207
5,737,750 A 4/1998 Kumar et al.
(Continued)

OTHER PUBLICATIONS

Young Jung Ahn, Saturating counter design for meta predictor in hybrid branch prediction, 2009 (Year: 2009), http://www.wseas.us/e-library/conferences/2009/tenerife/CSECS/CSECS-37.pdf.*

(Continued)

*Primary Examiner* — Ryan Bertram
(74) *Attorney, Agent, or Firm* — Robert A. Voigt, Jr.; Winstead, P.C.

(57) ABSTRACT

A processor architecture utilizing a L3 translation lookaside buffer (TLB) to reduce page walks. The processor includes multiple cores, where each core includes a L1 TLB and a L2 TLB. The processor further includes a L3 TLB that is shared across the processor cores, where the L3 TLB is implemented in off-chip or die-stack dynamic random-access memory. Furthermore, the processor includes a page table connected to the L3 TLB, where the page table stores a mapping between virtual addresses and physical addresses. In such an architecture, by having the L3 TLB with a very large capacity, performance may be improved, such as execution time, by eliminating page walks, which requires multiple data accesses.

20 Claims, 6 Drawing Sheets

(51) Int. Cl.
- *G06F 3/06* (2006.01)
- *G06F 12/1009* (2016.01)
- *G11C 7/10* (2006.01)
- *G06F 11/07* (2006.01)
- *G06F 12/0802* (2016.01)

(52) U.S. Cl.
CPC ...... *G06F 12/0802* (2013.01); *G06F 12/1009* (2013.01); *G06F 12/1054* (2013.01); *G11C 7/1006* (2013.01)

(56) References Cited

U.S. PATENT DOCUMENTS

| | | | |
|---|---|---|---|
| 7,243,218 B2* | 7/2007 | Winberg | G06F 9/383 712/225 |
| 7,293,157 B1 | 11/2007 | Parikh et al. | |
| 9,690,714 B1* | 6/2017 | Sites | G06F 12/1009 |
| 10,133,675 B2* | 11/2018 | Hansson | G06F 12/1009 |
| 2002/0062418 A1 | 5/2002 | Luick | |
| 2002/0073282 A1* | 6/2002 | Chauvel | G06F 1/206 711/122 |
| 2004/0230745 A1* | 11/2004 | Navarro | G06F 12/0851 711/127 |
| 2006/0206686 A1* | 9/2006 | Banerjee | G06F 12/1027 711/205 |
| 2007/0204129 A1* | 8/2007 | Nishino | G06F 12/1036 711/202 |
| 2009/0210625 A1* | 8/2009 | Luick | G06F 12/1054 711/122 |
| 2010/0205344 A1 | 8/2010 | Caprioli et al. | |
| 2011/0153955 A1 | 6/2011 | Herrenschmidt et al. | |
| 2012/0117301 A1* | 5/2012 | Wingard | G06F 12/1027 711/6 |
| 2013/0262816 A1* | 10/2013 | Ronen | G06F 12/1027 711/207 |
| 2014/0052917 A1* | 2/2014 | Koka | G06F 12/1027 711/120 |
| 2016/0092235 A1* | 3/2016 | Gonzalez-Alberquilla | G06F 9/3824 712/220 |
| 2016/0140040 A1* | 5/2016 | Mukherjee | G06F 12/1027 711/135 |
| 2016/0140050 A1* | 5/2016 | Kujtkowski | G06F 12/1027 711/108 |
| 2016/0231933 A1* | 8/2016 | Loh | G06F 3/0604 |
| 2016/0232107 A1* | 8/2016 | Ros | G06F 12/1045 |
| 2016/0275017 A1* | 9/2016 | Takeda | G06F 12/0893 |
| 2016/0342523 A1* | 11/2016 | Rozario | G06F 12/0844 |
| 2016/0342526 A1* | 11/2016 | Chang | G06F 12/1063 |
| 2018/0150406 A1 | 5/2018 | John et al. | |
| 2018/0232313 A1* | 8/2018 | Nikoleris | G06F 12/0895 |

OTHER PUBLICATIONS

Using conditional expressions and incrementing /decrementing a variable, Sep. 12, 2016, StackOverflow, 2 pages (Year: 2016), https://stackoverflow.com/questions/39456952/using-conditional-expressions-and-incrementing-decrementing-a-variable#.*

Marathe et al., "CSALT: Context Switch Aware Large TLB," Proceedings of the 50th Annual IEEE/ACM International Symposium on Microarchitecture, Cambridge, Massachusetts, Oct. 14-18, 2017, pp. 449-462.

Barr et al., "Translation Coaching: Skip, Don't Walk (the Page Table)," Proceedings of the 37th International Symposium on Computer Architecture (ISCA 2010), Jun. 19-23, 2010, pp. 48-59.

Office Action for U.S. Appl. No. 15/706,573 dated Sep. 7, 2018, pp. 1-29.

Ryoo et al., "Rethinking TLB Designs in Virtualized Environments: A Very Large Part-of-Memory TLB," ISCA '17 Proceedings of the 44th Annual International Symposium on Computer Architecture, Toronto, Ontario, Canada, Jun. 24-28, 2017, pp. 469-480.

Yaniv et al., "Hash, Don't Cache (the Page Table)," Sigmetrics'16, Antibes Juan-Les-Pins, France, Jun. 14-18, 2016, pp. 337-350.

Gandhi et al., "Efficient Memory Virtualization: Reducing Dimensionality of Nested Page Walks," Proceedings of the 47th Annual IEEE/ACM International Symposium on Microarchitecture, Cambridge, United Kingdom, Dec. 13-17, 2014, pp. 178-189.

* cited by examiner

FIG. 5

PROCESSOR USING A LEVEL 3 TRANSLATION LOOKASIDE BUFFER IMPLEMENTED IN OFF-CHIP OR DIE-STACKED DYNAMIC RANDOM-ACCESS MEMORY

TECHNICAL FIELD

The present invention relates generally to memory virtualization, and more particularly to a processor design using a L3 translation lookaside buffer (TLB) implemented in off-chip or die-stacked dynamic random-access memory.

BACKGROUND

Cloud services, such as Amazon® EC2 or Rackspace® OpenStack, use virtualization platforms to provide their services. These platforms use hypervisors (ESX, kernel-based virtual machine (KVM), Xen) to enable easier scalability of applications and higher system utilization by abstracting the underlying host resources. Unfortunately, these systems have an increased level of memory virtualization pressure as hypervisors and guests keep separate page tables. A page table is a data structure configured to store the mapping between the virtual addresses and the physical addresses. The amount of address translation increases as the hypervisor-based systems involve two dimensional page table walks (to determine whether a mapping between the virtual address and the physical address exists in the page table). In a system with radix-4 page tables as in recent x86 processors, a translation lookaside buffer (TLB) miss can result in up to 24 memory accesses, resulting in huge translation overheads. A TLB stores the recent translations of virtual memory to physical memory. With the increased number of processor cores and big data sets, conventional static random-access memory (SRAM) TLBs, whose capacities are constrained by latency requirements, cannot hold all translations of "hot pages" (pages accessed frequently). While higher hit rates are desirable, larger SRAM TLBs incur higher latencies.

Unfortunately, there is not currently a means for designing a processor architecture structure that provides performance improvement in a virtualized environment, namely, eliminating a large number of expensive page table walks.

SUMMARY

In one embodiment of the present invention, a processor comprises a first processor core comprising a first level translation lookaside buffer and a second level translation lookaside buffer. The processor further comprises a second processor core comprising a first level translation lookaside buffer and a second level translation lookaside buffer. The processor additionally comprises a third level translation lookaside buffer connected to the first and second processor cores, where the third level translation lookaside buffer is shared across the first and second processor cores. Furthermore, the third level translation lookaside buffer is implemented in memory or a storage device, where the first, second and third level translation lookaside buffers store recent translations of virtual memory to physical memory. Additionally, the processor comprises a page table connected to the third level translation lookaside buffer, where the page table stores a mapping between virtual addresses and physical addresses.

In another embodiment of the present invention, a processor comprises a processor core comprising a first level translation lookaside buffer and a second level translation lookaside buffer. The processor further comprises a third level translation lookaside buffer connected to the processor core, where the third level translation lookaside buffer is implemented in memory or a storage device. The first, second and third level translation lookaside buffers store recent translations of virtual memory to physical memory. Furthermore, the processor comprises a page table connected to the third level translation lookaside buffer, where the page table stores a mapping between virtual addresses and physical addresses.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art.

As stated in the Background section, there is not currently a means for designing a processor architecture structure that provides performance improvement in a virtualized environment, namely, eliminating a large number of expensive page table walks.

The principles of the present invention provide a processor architecture that utilizes a very large capacity TLB structure that can house nearly all required translations, eliminating a large number of expensive page table walks. In one embodiment, slow memory structures, such as dynamic random-access memory (DRAM) or die-stacked DRAM can be used as a large capacity TLB for virtualized environments. The proposed TLB can achieve a 10% performance improvement over a baseline system even if implemented in off-chip DRAM. If implemented in die-stacked DRAM, the average improvement is 12.5% in 8-core systems. For the Princeton Application Repository for Shared-Memory Computers (PARSEC) benchmarks, a 16% speedup is obtained.

A brief discussion regarding memory virtualization is now deemed appropriate. Conventional x86 processors typically employ a 2-level hierarchy of TLBs on a per-core basis. The L1 TLB is small and fast retaining only a few tens of recently used translations to ensure rapid address translation for recent virtual addresses. The L2 TLB is larger, typically caching a few hundreds of translations. Additional techniques to reduce the overhead of page walks include caching of page table entries in data caches, TLB prefetching, shared L2 TLBs, dedicated page walk caches, and speculative TLB fetching.

One of the largest contributors of performance overhead in virtualized environments is memory virtualization. An application executing on a guest operating system (OS) generates guest virtual addresses (gVA) that need to be translated to host physical addresses (hPA). Since physical memory is under the exclusive control of a hypervisor, every guest physical address (gPA) needs to be translated to a host physical address before the guest application-issued memory access can complete. This requires navigating through two sets of page tables: a guest page table that the guest OS implements (gVA→gPA), and a host page table that the hypervisor implements (gPA→hPA). In the worst case, a few tens of memory accesses are required to complete the full 2D translation.

In order to bridge this performance gap associated with virtualized environments, recent processors have added architecture support in the form of nested page tables and extended page tables that cache guest-to-host translations. Processor vendors have also added dedicated page walk caches to cache the contents of guest and host page tables. Despite these 2D walk accelerators, the overhead of page walks continues to be a source of inefficiency in virtualized environments (running into 100+ cycles in some benchmarks).

The following describes the very large L3 TLB of the present invention which can be implemented in off-chip or die-stacked DRAMs to address such inefficiencies.

While the following discusses the present invention in connection with a processor architecture implementing a very large L3 TLB utilizing multiple cores, the present invention may implement a very large L3 TLB utilizing a processor architecture with a single processor core. A person of ordinary skill in the art would be capable of applying the principles of the present invention to such implementations. Further, embodiments applying the principles of the present invention to such implementations would fall within the scope of the present invention.

Furthermore, while the following discusses the present invention in connecting with implementing the very large L3 TLB in off-chip or die-stack dynamic random-access memory, the present invention may implement the very large L3 TLB in other types of memory or a storage device, such as phase-change memory (PCM) or non-volatile random-access memory (NVRAM). A person of ordinary skill in the art would be capable of applying the principles of the present invention to such implementations. Further, embodiments applying the principles of the present invention to such implementations would fall within the scope of the present invention.

Figure 1:
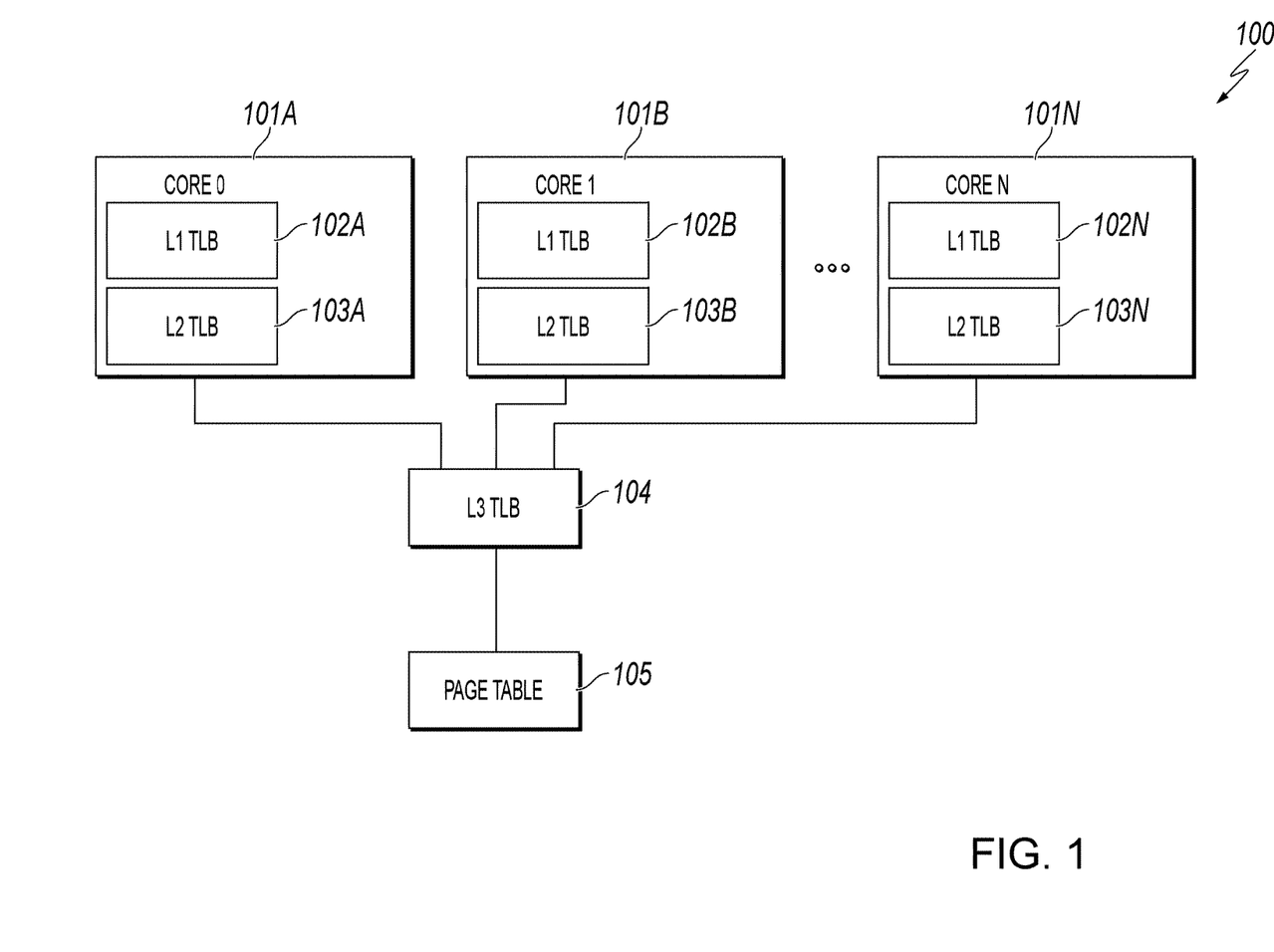
FIG. 1 illustrates a processor architecture implementing a very large L3 translation lookaside buffer (TLB) in accordance with an embodiment of the present invention.

Referring to FIG. 1, FIG. 1 illustrates a processor architecture implementing a very large L3 TLB in accordance with an embodiment of the present invention. As illustrated in FIG. 1, processor 100 includes multiple processor cores 101A-101N (labeled as "Core 0," "Core 1," . . . "Core N−1"), where N is a positive integer number. Processor cores 101A-101N may collectively or individually be referred to as processor cores 101 or processor core 101, respectively. Such a multi-core processor 100 utilizes processor cores 101 to read and execute program instructions at the same time thereby increasing overall speed for programs amendable to parallel computing.

Each core 101 may include a first level (L1) and a second level (L2) TLB. For example, core 101A includes L1 TLB 102A and L2 TLB 103A. Core 101B includes L1 TLB 102B and L2 TLB 103B and core 101N includes L1 TLB 102N and L2 TLB 103N. L1 TLBs 102A-102N, where N is a positive integer number, may collectively or individually be referred to as L1 TLBs 102 or L1 TLB 102, respectively. Furthermore, L2 TLBs 103A-103N, where N is a positive integer number, may collectively or individually be referred to as L2 TLBs 103 or L2 TLB 103, respectively.

Each core 101 is connected to a L3 TLB 104 that is shared across the processor cores 101. In one embodiment, L3 TLB 104 is implemented in off-chip or die-stack dynamic random-access memory. While the following discusses L3 TLB 104 being implemented in off-chip or die-stack dynamic random-access memory, L3 TLB 104 may be implemented in any type of memory or storage device (e.g., phase-change memory (PCM), non-volatile random-access memory (NVRAM)).

Each of these TLBs 102A-102C, 103A-103C and 104 store recent translations of virtual memory to physical memory.

Furthermore, processor 100 includes a page table 105 connected to L3 TLB 104, where page table 105 stores a mapping between virtual addresses and physical addresses.

In one embodiment, since capacity of L3 TLB 104 is very large, L3 TLB 104 is mostly inclusive of L1 and L2 TLBs 102, 103, so entries are shared across all cores 101.

When an L2 TLB 103 miss is forwarded to L3 TLB 104, if there is no match for the requested translation, a conventional page table walk (determine whether a mapping between the virtual address and the physical address exists in page table 105) is initiated. The address translation target is returned and the appropriate L3 TLB entry is filled. After warm up, L3 TLB 104 is big enough to hold nearly all translations, and hence most accesses will be hits. A shared TLB structure means that the sources of the hit in multi-threaded programs can come from other cores 101 because there is a considerable amount of inter-core locality. When the leading translation miss (the first miss to the corresponding entry in L3 TLB 104) is resolved, subsequent requests to this entry from other cores 101 are likely to hit in L3 TLB 104. These hits are additional hits to those generated by temporal locality where the hit entry was populated in the recent past from the same core 101.

While conceptually not a requirement, implementing L3 TLB 104 in emerging die-stacked DRAMs integrated onto the processor gives bandwidth and possibly small latency advantages. Die-stacked DRAM has a DRAM-like organization, typically with access granularities, such as 64 bytes (B).

Figure 2:
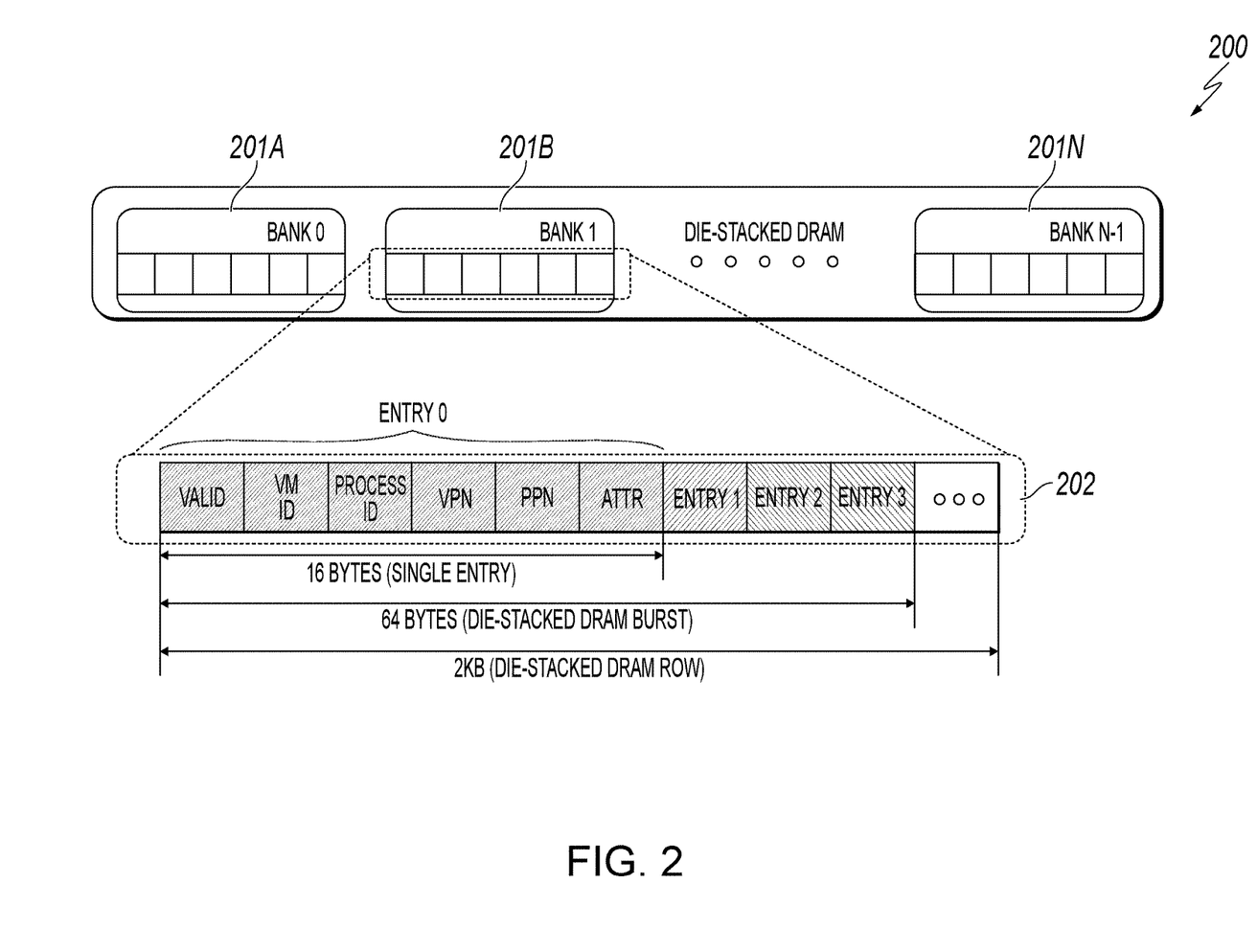
FIG. 2 illustrates a single channel of a typical die-stacked DRAM with multiple banks in accordance with an embodiment of the present invention.

FIG. 2 illustrates a single channel of a typical die-stacked DRAM 200 with multiple banks 201A-201N, where N is a positive integer, in accordance with an embodiment of the present invention. Banks 201A-201N may collectively or individually be referred to as banks 201 or bank 201, respectively. The detailed layout of a single row 202 in a bank 201 is shown in FIG. 2. Each row 202 can house multiple TLB entries (see example of entries 0 to 3 in FIG. 2) as the row size in one embodiment is 2 KB. Each entry, such as shown in entry 0 of FIG. 2, has a valid bit ("valid"), process ID ("Process ID"), virtual address ("VPN"), physical address ("PPN"), and attribute ("Attr"). To facilitate the translation in virtualized platforms, each entry, such as shown in entry 0 of FIG. 2, has a virtual machine ID ("VM ID") to distinguish addresses coming from different virtual machines. The attributes ("Attr") include information, such as replacement and protection bits. In one embodiment, each entry is 16 B and four entries (entries 0 to 3) make 64 B. In one embodiment, L3 TLB 104 is implemented as a four way associative structure since 1) the associativity lower than four invokes significantly higher conflict misses and 2) 64 B is the common die-stacked DRAM burst length where no memory controller design modifications are necessary. Upon a request, four entries are fetched from a single die-stacked DRAM row. In one embodiment, the row size can incorporate 32 unique entries and with 4 way associativity, each row holds 8 unique sets of TLB entries.

Figure 3A:
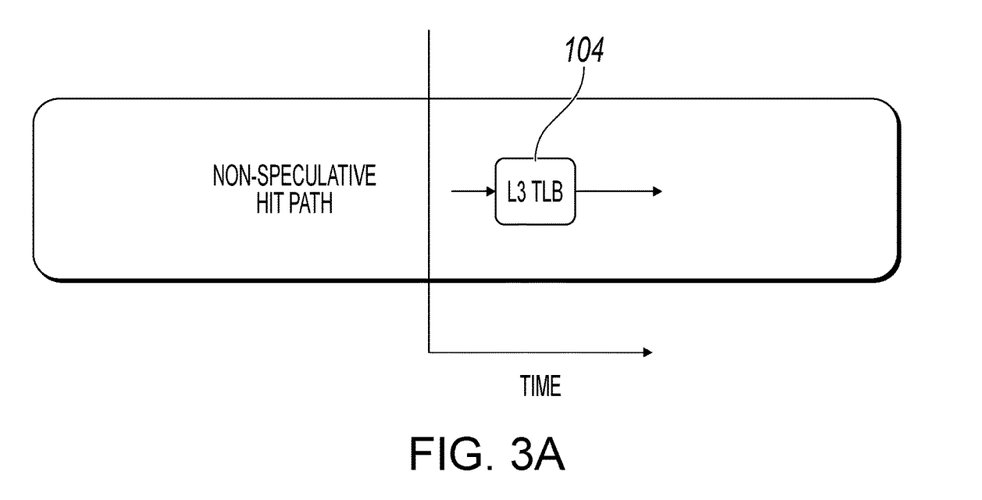
FIGS. 3A and 3B show the non-speculative path for hit/miss cases, respectively, in accordance with an embodiment of the present invention.
Figure 3B:
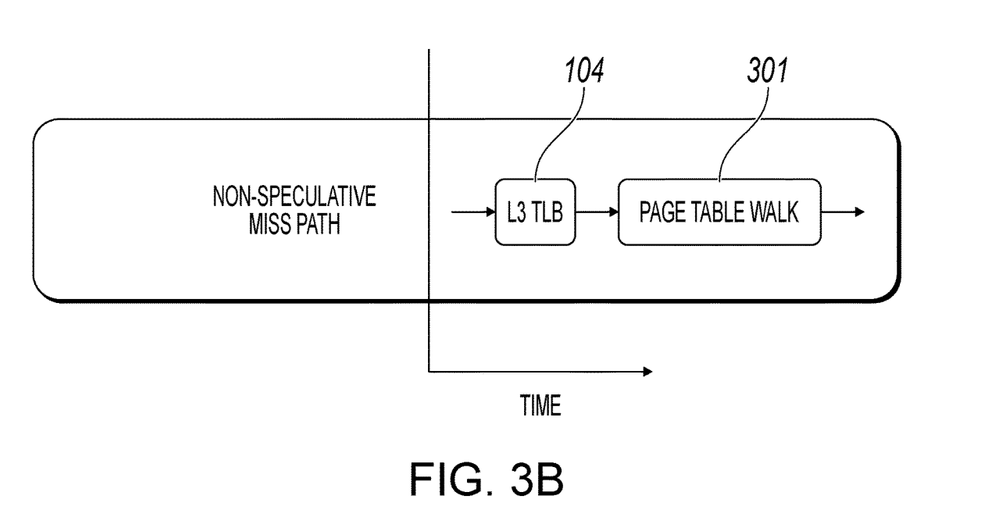
Figure 3C:
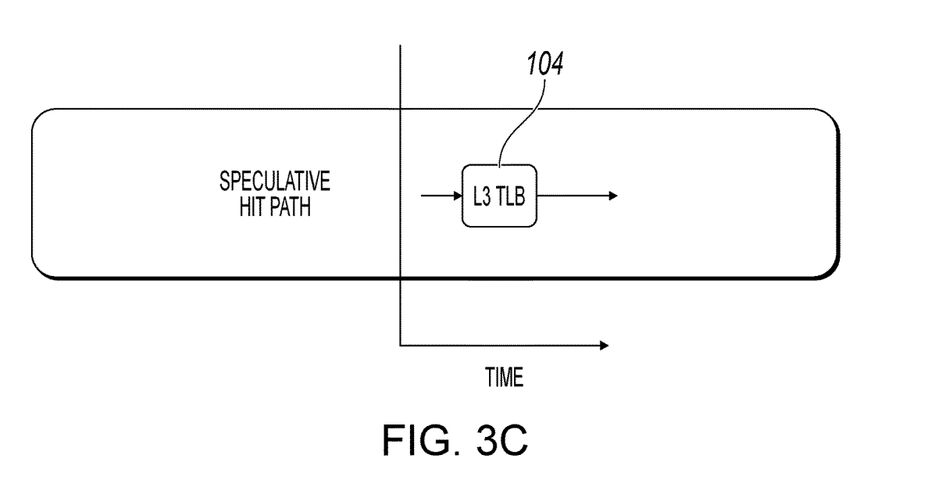
FIGS. 3C and 3D show the speculative path for hit/miss cases, respectively, in accordance with an embodiment of the present invention.
Figure 3D:
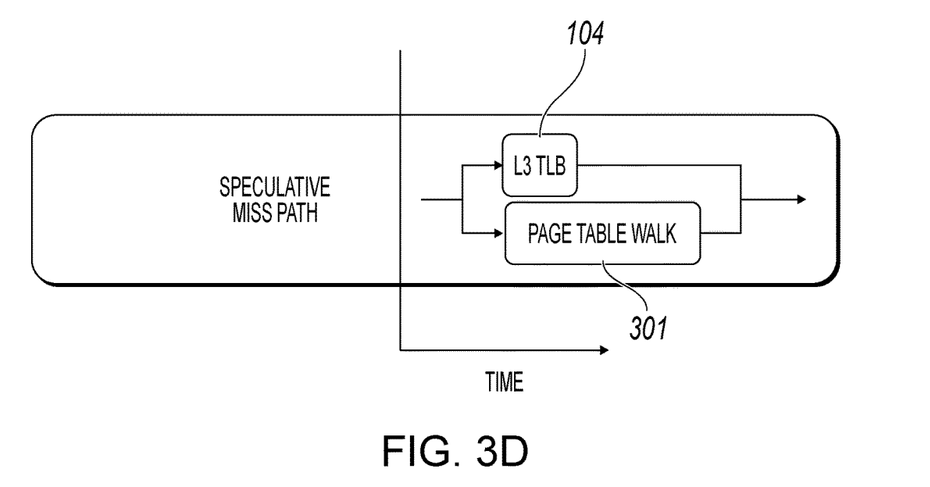

Unlike on-chip SRAM TLBs, the miss penalty of L3 TLB 104 is high since the page table walk has to wait until the latency of fetching an entry from DRAM. The hit/miss outcome can only be identified after four entries are completely retrieved from L3 TLB 104. The penalty of an L3 TLB miss can be reduced using a predictor (which is discussed further below). FIGS. 3A and 3B show the non-speculative path for hit/miss cases, respectively, in accordance with an embodiment of the present invention. On a hit, the fetched entry is directly used to service the request. However, upon a miss, which occurs only after accessing the slow die-stacked DRAM, the page table walk (PTW) 301 is initiated. FIGS. 3C and 3D show the speculative path for hit/miss cases, respectively, in accordance with an embodiment of the present invention. When the predictor outcome is a hit, the latency stays the same as shown in FIG. 3C. Nonetheless, when the miss outcome is speculated, the page table walk 301 is initiated along with the L3 TLB access. Since the L3 TLB access is overlapped with the page table walk (PTW) 301, the slow die-stacked DRAM latency is significantly reduced as shown in FIG. 3D.

Figure 4:
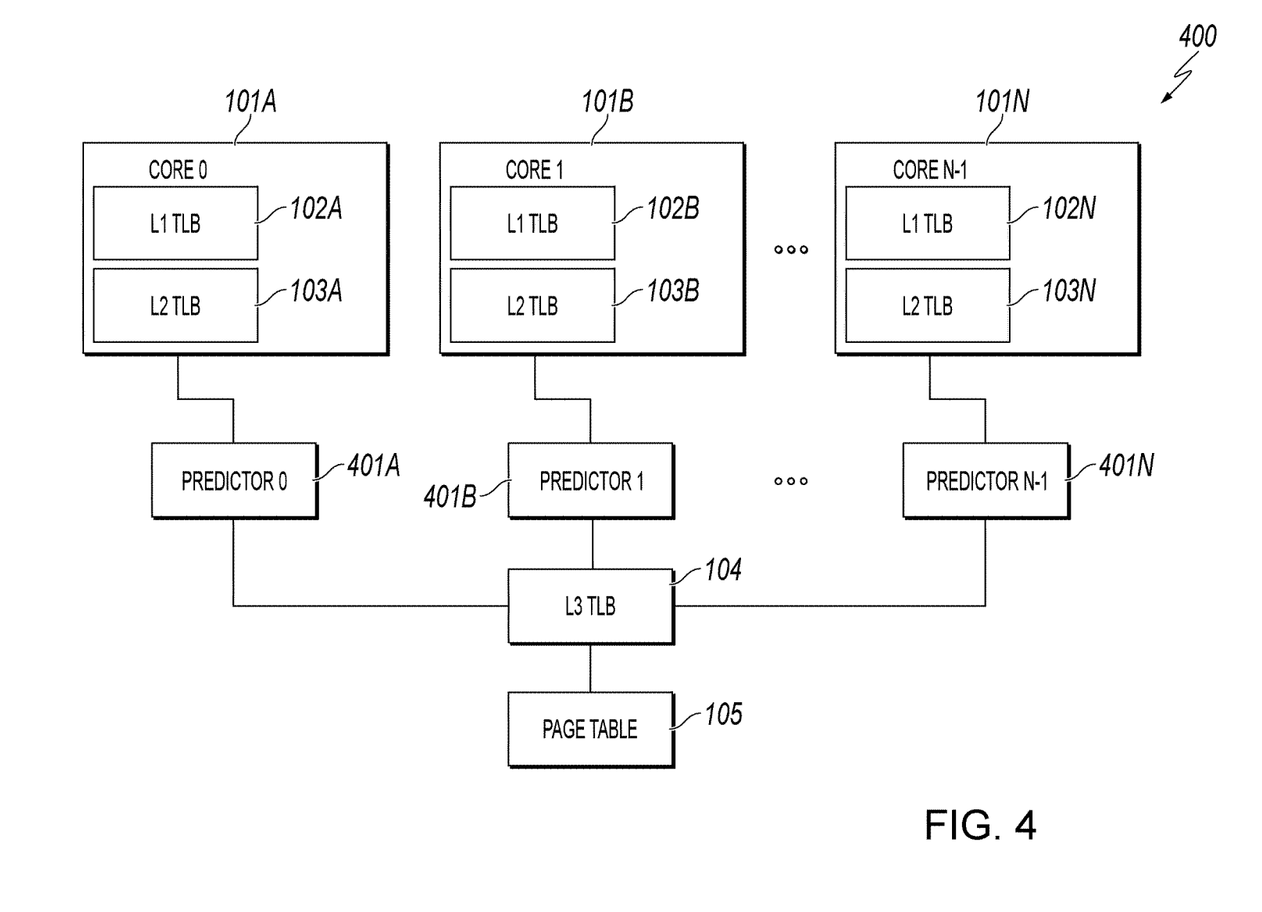
FIG. 4 illustrates the processor architecture of FIG. 1 that implements a predictor in accordance with an embodiment of the present invention.

Referring now to FIG. 4, FIG. 4 illustrates the processor architecture of FIG. 1 (processor 400) that implements a predictor 401A-401N, where N is a positive integer number, in accordance with an embodiment of the present invention. Predictors 401A-401N may collectively or individually be referred to as predictors 401 or predictor 401, respectively.

As shown in FIG. 4, the elements of processor 400 of FIG. 4 that are the same as processor 100 of FIG. 1 include the same reference numerals. As further illustrated in FIG. 4, in one embodiment, each predictor 401 is connected to an associated processor core 101. Such a predictor 401 is referred to herein as the "Core partitioned History Counter Predictor (CHCP)" which predicts the L3 TLB entry location and helps to reduce the L3 TLB miss penalty. In one embodiment, predictor 401 is used to track a history of hits to L3 TLB 104. In one embodiment, it is implemented using a three bit saturating counter per predictor entry. The counter is indexed using a portion of the virtual address. The counter is incremented upon a L3 TLB hit and decremented upon a miss. If the counter value is greater than a threshold (e.g., 3), then predictor 401 speculates it as a hit and vice-versa. By using the counter, one can effectively eliminate outlier predictions, and thus, retain the high accuracy. In order to reduce the interference between cores 101, the implementation shown in FIG. 4 is used. In one embodiment, it is assumed that each core 101 has CHCP 401 with 256 entries (256*3 bits=96 B). For each of 4, 8 and 32 cores, the predictor overheads are 384 B, 768 B, 3072 B, respectively.

Due to consistency issues, predictor 401 may be bypassed for write requests. It is noted that predictor 401 uses information (virtual address) that is passed down to L3 TLB 104. Although using an instruction address can increase the accuracy, doing so requires adding a 64-bit bus all the way down to die-stacked DRAM, which is highly costly. Therefore, such approaches are avoided. In addition, L3 TLB 104 already has a high hit rate, so additional accuracy gained by adding such a dedicated path is not well justified.

Since TLB 104 is shared across cores 101, the consistency requirement between entries in L3 TLB 104 and underlying L1/L2 TLB 102/103 has to be met. Although strictly inclusive L3 TLB 104 is desirable, it adds significant hardware complexity. Since, in one embodiment, L3 TLB 104 operates at DRAM latency, which is already much slower than on-chip SRAM TLBs 102, 103, adding such structure is not a practical option. As a result, the mostly inclusive implementation is adopted, which is adopted in x86 caches. In this design, each TLB can make independent replacement decisions, which makes it possible that some entries in L1/L2 TLBs 102, 103 are missing from L3 TLB 104. However, this significantly reduces the hardware overheads associated with keeping strictly inclusive. Therefore, L3 TLB 104 is designed to be aware of TLB-shootdowns. TLB-shootdowns require all corresponding TLBs to be locked until the consistency issue is resolved. Yet, TLB-shootdowns are rare occurrences and recent work has shown a shootdown mechanism can significantly reduce the overheads. Thus, the benefits of having simpler consistency check hardware outweigh the shootdown overheads, and hence such a design can be adopted.

In addition, in one embodiment, the consistency across different virtual machines is already handled by an underlying Kernel-based Virtual Machine (KVM) hypervisor. Upon a change in TLB, a memory notifier is called to let the host system know that a guest TLB has been updated. Then, the host OS invalidates all related TLBs in other virtual machines. Therefore, issues, such as dirty page handling, process ID recycling, etc. are already incorporated in KVM and host OS. The recent adoption of VM ID facilitates this process, and thus, L3 TLB 104 can maintain consistency in the presence of multiple virtual machines.

A traditional TLB architecture assumes blocking accesses where each private TLB handles one request at a time. However, due to the shared nature of L3 TLB 104, L3 TLB 104 needs to be able to handle multiple simultaneous requests from multiple cores 101. Die-stacked DRAM has its own controllers for request scheduling purposes, and thus, queues are already implemented in the controllers. Consequently, L3 TLB 104 is able to handle multiple outstanding requests without having to add separate queues.

Furthermore, memory systems share a common command/data bus to exchange data between controllers and multiple banks. Many of today's applications experience memory contention as the bandwidth is either saturated or near saturation. Implementing L3 TLB 104 in an integrated die-stacked DRAM offers advantages from this perspective. In one embodiment, the present invention adds additional traffic only to the integrated DRAM to retrieve translation entries and not to the off-chip DRAM. The path from processors to die-stacked DRAM architecture is different from one to off-chip DRAM as it has its own dedicated high-speed bus to communicate with processors. Hence, additional traffic due to L3 TLB 104 does not interfere with existing main memory traffic. In fact, the high hit rate of L3 TLB 104 reduces a significant amount of page table walks that result in main memory accesses, so it is likely that the main memory traffic sees considerable performance benefits as well.

As discussed above, in one embodiment, L3 TLB 104 is implemented as a four way associative structure. As a result, the attribute metadata (annotated as Attr in FIG. 2) contains 2 least recently used (LRU) bits. These bits are updated upon each access to L3 TLB 104 and the appropriate eviction candidate is chosen using these bits. Since LRU bits of four entries are fetched in a DRAM burst, the replacement decision can be made without incurring additional die-stacked DRAM accesses.

Die-stacked DRAM capacity is growing to multi-gigabytes, and in experiments involving the present invention, L3 TLB 104 achieves good performance at capacities, such as 64 MB. The remaining die-stacked DRAM capacity can be used as a large last level data cache or a part of memory.

Assuming a 64 MB capacity for L3 TLB 104, there can be a tradeoff between using this additional capacity as a L4 data cache versus a L3 TLB 104. In a cache design, a hit saves one memory access. However, in the case of L3 TLB 104, especially in a virtualized environment, the L3 TLB hit can save up to 24 accesses. This significantly reduces the total number of overall memory accesses. In experiments involving the present invention in a virtualized environment, it was found that the average walk cycles is above 100 cycles per page walk, whereas, the off-chip DRAM access time is approximately 50 cycles. Therefore, each hit in the stacked DRAM improves the translation costs by 70 cycles (100 cycles minus 30 cycles), whereas, using it as a L4 cache saves 20 cycles (50 cycles minus 30 cycles). Furthermore, data accesses are non-blocking accesses where multiple requests can be on the fly. The access latency can be hidden by means of memory level parallelism, such as bank level parallelism, which is common in today's DRAM. On the other hand, an address translation is a critical blocking request where upon a TLB miss, the processor execution stalls. Therefore, the impact of serving the translation request is much higher. Consequently, using the same capacity as a large TLB is likely to save more cycles than using it as L4 data cache. Note that 64 MB is a small fraction of a die-stacked DRAM, and the rest of die-stacked DRAM can be used as a large data cache via separate channel without translation traffic contention.

In an alternative embodiment, L3 TLB 104 (FIG. 1) is made addressable thereby enabling the caching of TLB entries in data caches as discussed below in connection with FIG. 5.

Figure 5:
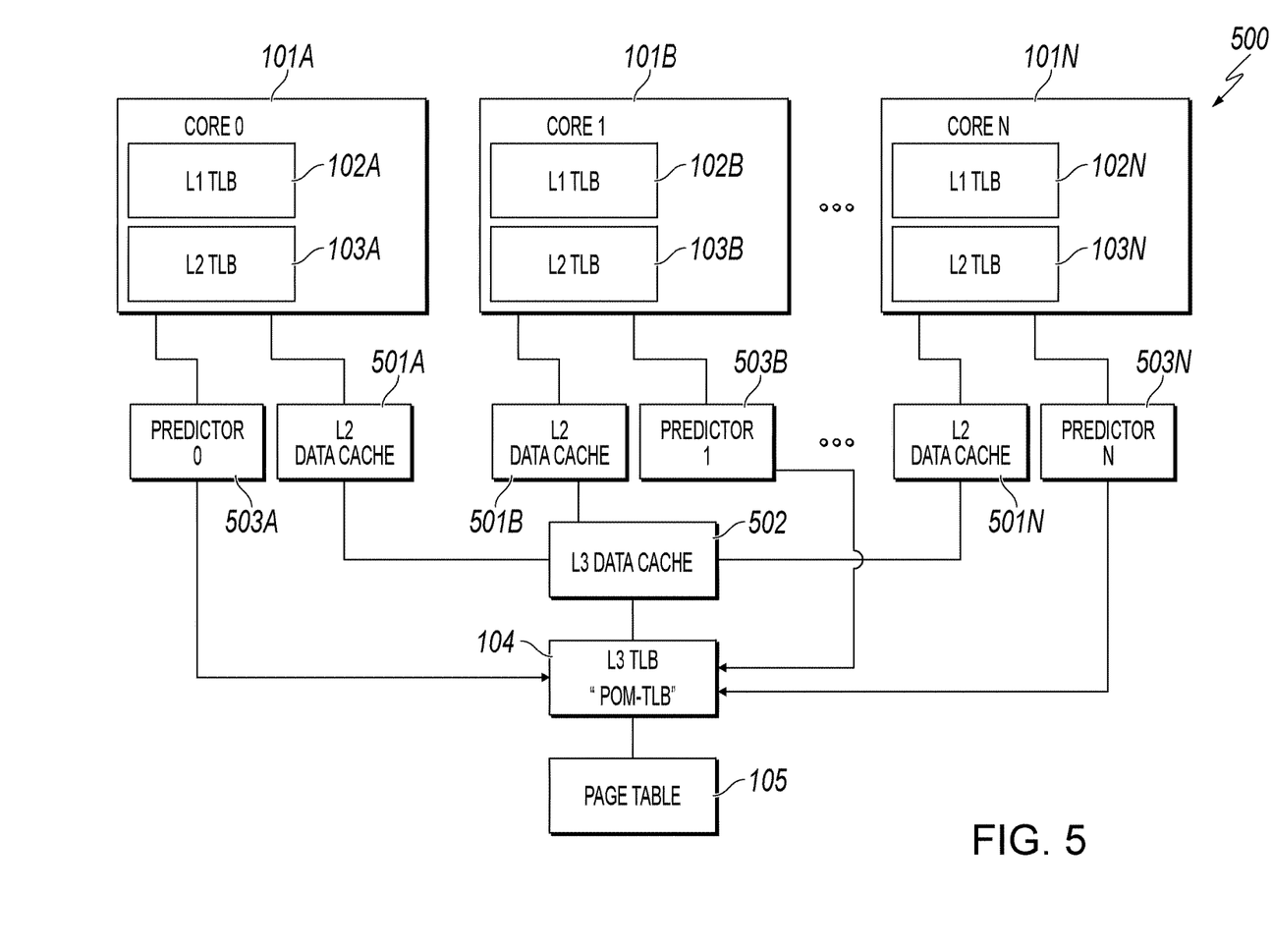
FIG. 5 illustrates a processor architecture implementing the very large L3 TLB of FIG. 1 that is made addressable thereby enabling the caching of TLB entries in data caches in accordance with an embodiment of the present invention.

FIG. 5 illustrates a processor architecture implementing the very large L3 TLB of FIG. 1 that is made addressable thereby enabling the caching of TLB entries in data caches in accordance with an embodiment of the present invention.

Referring to FIG. 5, elements of processor 500 of FIG. 5 that are the same as processor 100 of FIG. 1 include the same reference numerals. Processor 500 is similar to processor 100 of FIG. 1 except that processor 500 includes L2 data caches 501A-501N connected to processor cores 101A-101N, respectively, where N is a positive integer number. L2 data caches 501A-501N may collectively or individually be referred to as L2 data caches 501 or L2 data cache 501, respectively. Furthermore, processor 500 includes a L3 data cache 502 connected to L2 data caches 501 and L3 TLB 104. Additionally, processor 500 includes predictors 503A-503N connected to processor cores 101A-101N, respectively, where N is a positive integer number, as well as connected to L3 TLB 104. Predictors 503A-503N may collectively or individually be referred to as predictors 503 or predictor 503, respectively.

As discussed above, FIG. 5 illustrates a processor architecture that enables the caching of TLB entries in data caches 501, 502 by making L3 TLB 104 addressable. That is, L3 TLB 104 is made part of memory (referred to herein as the "POM-TLB"). In the POM-TLB 104, only one access is required instead of up to 24 accesses required in commonly used 2D walks with radix-4 type of page tables. Even if many of the 24 accesses may hit in the page walk caches, the aggregated cost of the many hits plus the overhead of occasional misses from page walk caches still exceeds the cost of one access to POM-TLB 104. Since POM-TLB 104 is part of the memory space, TLB entries (as opposed to multiple page table entries) can be cached in large L2 and L3 data caches 501, 502, yielding significant benefits.

While L1 and L2 TLBs 102, 103 are designed for fast look-up, POM-TLB 104 is designed for very large reach and consequently its DRAM-based implementation incurs higher access latency. In order to alleviate the higher access latency, POM-TLB 104 is mapped into the physical address space. By making TLB 104 addressable, the benefit of enabling the caching of TLB entries in data caches 501, 502 is achieved. Both $POM\_TLB_{Small}$ and $POM\_TLB_{Large}$ are assigned address ranges. POM-TLB 104 comprising N sets is assigned an address range of 64×N bytes as each holds four 16-byte TLB entries. The virtual address (VA) of the L2 TLB 103 miss is converted to a set index of POM-TLB 104 by extracting $log_2(N)$ bits of the VA (after XOR-ing them with the VM ID bits to distribute the set-mapping evenly). For the $POM\_TLB_{Small}$, the memory address of the set that the VA maps to is given by:

$$Addr_{POM\_TLB\_Small}(VA) = \\ ((VA \oplus VM\_ID) >> 6)(1 << log_2(N)-1))* \\ 64 + Based\_Addr_{POM\_TLB\_Small}$$

In one embodiment, $Base\_Addr_{POM\_TLB\_Small}$ is the starting address of the $POM\_TLB_{Small}$.

In one embodiment, $POM\_TLB_{Large}$ addresses are computed similarly.

In one embodiment, L2 TLB 103 misses do not initiate page walks. Instead, for each L2 TLB 103 miss, the memory management unit (MMU) computes the POM-TLB (e.g., $POM\_TLB_{Large}$) set address where the TLB entry for the virtual address of the miss may be found. The MMU then issues a load request to L2 data cache 501 with this address. At this point, this becomes a normal cache access. If the entry is found in L2 data cache 501, then the MMU reads the L2 data cache 501 block (64 B) to access all the four translation entries stored in it. In one embodiment, it performs an associative search of the four entries to find a match for the incoming virtual address. If a match is found, then the corresponding entry provides the translation for this address. Being a normal read access, if L2 data cache 501 does not contain the $POM\_TLB_{Large}$ address, then the request is issued to L3 data cache 502. If no match is found in L3 data cache 502, then the physical memory (in this case a $POM\_TLB_{Large}$ location) is accessed. Associative search of the set stored in the $POM\_TLB_{Large}$ is used to identify if a translation of the virtual address is present or not. Like data misses, TLB entries that are misses in data caches are filled into the caches after resolving them at POM-TLB 104 or via page walks.

Since POM-TLB 104 provides two potential set locations where the translation for a given VA may be found (POM_TLB$_{Small}$ and POM_TLB$_{Large}$), two cache look-ups starting with L2 data cache 501 would have to be performed. Assuming an equal number of accesses to 4 KB and 2 MB pages, an additional 50% increase in TLB look-up accesses into L2 data cache 501 occurs. This has both latency and power implications which is addressed by predictors 503.

In one embodiment, predictor 503 comprises 512 2-bit entries, with one of the bits used to predict the page size and the other bit used to predict whether to bypass the caches (discussed further below). Predictor 503 is indexed using 9 bits of the virtual address of a L2 TLB 103 miss (ignoring the lower order 12 bits). If the predicted page size is incorrect (0 means 4 KB, 1 means 2 MB), then the prediction entry for the index is updated. While consuming very little SRAM storage (128 bytes per core 101), it achieves very high accuracy.

In workloads where the data load/store access rate to data caches 501, 502 far exceeds the rate of L2 TLB 103 misses, caches 501, 502 tend to contain very few POM-TLB entries since they get evicted to make room to fill in data misses. In such a scenario, looking up data caches 501, 502 before reaching POM-TLB 104 is wasteful in terms of both power and latency. Thus, a 1-bit bypass predictor (one of the bits in the 2-bit entries of predictor 503) is incorporated to bypass caches 501, 502.

Hence, by using the processor architecture of the present invention that utilizes a very large capacity L3 TLB structure in DRAMs, a significant amount of page table walks is eliminated in virtualized environments. By utilizing such a large capacity L3 TLB structure, the page walk overhead in most memory intensive workloads can be practically eliminated, particularly those in virtualized and multithreaded environments. Simulation studies with various number of cores running Standard Performance Evaluation Corporation (SPEC) and PARSEC workloads demonstrated that up to 27.5% performance improvement can be obtained in some benchmarks (with an average of 12.5% over all benchmarks). In most configurations, 99% of the page walks can be eliminated by a very large TLB of size 64 MB.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A processor, comprising:
   a first processor core comprising:
      a first level translation lookaside buffer; and
      a second level translation lookaside buffer;
   a second processor core comprising:
      a first level translation lookaside buffer; and
      a second level translation lookaside buffer;
   a third level translation lookaside buffer connected to said first and second processor cores, wherein said third level translation lookaside buffer is shared across said first and second processor cores, wherein said third level translation lookaside buffer is implemented in memory or a storage device, wherein said first, second and third level translation lookaside buffers store recent translations of virtual memory to physical memory;
   a page table connected to said third level translation lookaside buffer, wherein said page table stores a mapping between virtual addresses and physical addresses;
   a first and a second second level data cache connected to said first and second processor cores; and
   a third level data cache connected to said first and second second level data caches;
   wherein said third level translation lookaside buffer is mapped into a memory address space, wherein said third level translation lookaside buffer is addressable, wherein said processor is configured to cache said third level translation lookaside buffer entries in said first and second second level data caches and said third level data cache.

2. The processor as recited in claim 1, wherein said memory or said storage device comprises a dynamic random-access memory, wherein said dynamic random-access memory comprises a plurality of banks, wherein each of said plurality of banks comprises a row, wherein said row houses multiple translation lookaside buffer entries, wherein each of said translation lookaside buffer entries comprises a valid bit, a process identifier, a virtual address and a physical address.

3. The processor as recited in claim 2, wherein each of said translation lookaside buffer entries further comprises a virtual machine identifier.

4. The processor as recited in claim 1, wherein said third level translation lookaside buffer is implemented as a four way associative structure.

5. The processor as recited in claim 1 further comprising:
   a first history counter predictor connected to said first processor core; and
   a second history counter predictor connected to said second processor core;
   wherein said first and second history counter predictors are configured to track a history of hits to said third level translation lookaside buffer.

6. The processor as recited in claim 5, wherein said first and second history counter predictors are indexed using a portion of a virtual address.

7. The processor as recited in claim 6, wherein said first and second history counter predictors use a three bit saturating counter per predictor entry.

8. The processor as recited in claim 7, wherein said first and second history counter predictors are incremented in response to a hit to said third level translation lookaside buffer and are decremented in response to a miss to said third level translation lookaside buffer.

9. The processor as recited in claim 8, wherein said first and second history counter predictors speculate a hit to said third level translation lookaside buffer in response to a counter value exceeding a threshold value.

10. The processor as recited in claim 8, wherein said first and second history counter predictors speculate a miss to said third level translation lookaside buffer in response to a counter value not exceeding a threshold value.

11. The processor as recited in claim 1 further comprising:
   a first and a second predictor connected to said first and second processor cores and said third level translation lookaside buffer, wherein said first and second predictors comprise two-bit entries, wherein a first of said two-bits is used to predict whether to bypass said first and second second level data caches and said third level data cache.

12. The processor as recited in claim 11, wherein a second of said two-bits is used to predict a page size.

13. The processor as recited in claim 1, wherein said third level translation lookaside buffer is implemented in off-chip or die-stack dynamic random-access memory.

14. The processor as recited in claim 1, wherein said third level translation lookaside buffer is implemented in one of the following: phase-change memory and non-volatile random-access memory.

15. A processor, comprising:
a processor core comprising:
a first level translation lookaside buffer; and
a second level translation lookaside buffer;
a third level translation lookaside buffer connected to said processor core, wherein said third level translation lookaside buffer is implemented in memory or a storage device, wherein said first, second and third level translation lookaside buffers store recent translations of virtual memory to physical memory;
a page table connected to said third level translation lookaside buffer, wherein said page table stores a mapping between virtual addresses and physical addresses;
a first and a second second level data cache connected to said processor core; and
a third level data cache connected to said first and second second level data caches;
wherein said third level translation lookaside buffer is mapped into a memory address space, wherein said third level translation lookaside buffer is addressable, wherein said processor is configured to cache said third level translation lookaside buffer entries in said first and second second level data caches and said third level data cache.

16. The processor as recited in claim 15, wherein said memory or said storage device comprises a dynamic random-access memory, wherein said dynamic random-access memory comprises a plurality of banks, wherein each of said plurality of banks comprises a row, wherein said row houses multiple translation lookaside buffer entries, wherein each of said translation lookaside buffer entries comprises a valid bit, a process identifier, a virtual address and a physical address.

17. The processor as recited in claim 16, wherein each of said translation lookaside buffer entries further comprises a virtual machine identifier.

18. The processor as recited in claim 15, wherein said third level translation lookaside buffer is implemented as a four way associative structure.

19. The processor as recited in claim 15, wherein said third level translation lookaside buffer is implemented in off-chip or die-stack dynamic random-access memory.

20. The processor as recited in claim 15, wherein said third level translation lookaside buffer is implemented in one of the following: phase-change memory and non-volatile random-access memory.

* * * * *